United States Patent [19]

Davis, Jr.

[11] 4,309,598
[45] Jan. 5, 1982

[54] VARIABLE RATE DATA ENTRY APPARATUS AND METHOD
[75] Inventor: James M. Davis, Jr., Indialantic, Fla.
[73] Assignee: Rockwell International Corporation, El Segundo, Calif.
[21] Appl. No.: 79,632
[22] Filed: Sep. 27, 1979
[51] Int. Cl.³ .................. H03K 21/36; G06M 3/14
[52] U.S. Cl. .................. 235/92 MP; 235/92 PE; 235/92 EV; 235/92 DE
[58] Field of Search ........ 235/92 PE, 92 EA, 92 DE, 235/92 CT, 92 DP, 92 EV, 92 MP; 328/48

[56] References Cited
U.S. PATENT DOCUMENTS

| | | | |
|---|---|---|---|
| 3,835,384 | 9/1974 | Liff | 235/92 MP |
| 3,843,873 | 10/1974 | Beville et al. | 235/92 MP |
| 3,968,401 | 7/1976 | Bryant | 235/92 EV |
| 3,986,003 | 10/1976 | Pruessner | 235/92 EV |
| 4,036,431 | 7/1977 | Gidlof | 235/92 PE |
| 4,171,540 | 10/1979 | Arnold | 235/92 DE |

Primary Examiner—Joseph M. Thesz
Attorney, Agent, or Firm—Edward A. Gerlaugh; Richard A. Bachand; H. Frederick Hamann

[57] ABSTRACT

A digital display updated by inputs from a manual control having a plurality of tactile detents. A counter is loaded with a predetermined number and then decremented at a fixed rate until the number reaches one. The fixed rate is either the program cycle time of a microprocessor embodiment or the clock time of a circuit embodiment. Whenever a detent of the control is detected, the then current value of the counter is added to or subtracted from the display and the counter is again loaded with the predetermined number.

18 Claims, 10 Drawing Figures

VARIABLE RATE DATA ENTRY APPARATUS AND METHOD

BACKGROUND OF THE INVENTION

This invention relates to display apparatus and particularly to controls for altering displayed data at a selectable rate.

Digital displays of symbols representing operating parameters are commonly used in electronic devices such as communications, navigation, and data processing equipment as well as in diverse test equipment, manufacturing equipment and control apparatus. Known devices employing manual controls for entering data altering the operating parameters and the display thereof have taken various forms utilizing encoders for detecting the position of a smoothly rotating shaft, such as shown in U.S. Pat. Nos. 3,665,323; 3,835,384; and 4,125,295. A less complex arrangement utilizing a single switch providing discrete inputs for unit data entry, or alternately, fast data entry at a fixed rate, is shown in U.S. Pat. No. 4,036,431.

A method utilizing a discrete input event for unit data entry plus fast data entry at a rate depending on the speed of successive discrete input events was desired. One solution to the problem involved counting the number of discrete events (such as the number of contacts of a multiple position rotary switch) occurring in a fixed interval, and incrementing the display by an input quantity in accordance with a preselected gain signal, e.g., a single contact detected during the interval resulted in changing the input quantity by one least-significant digit (LSD) of the display, and movement of the switch N positions per interval resulted in a change of M (LSD), where M was a preselected number greater than 1. The performance of the control was adequate but less than ideal because of limited resolution of the gain schedule and lack of proper "feel" of the control during fast operation.

Accordingly, it is an object of the present invention to provide an improved method and apparatus for entering data altering a digital display.

Another object of the invention is to provide an improved method and apparatus for rapidly varying a displayed digital data field of wide dynamic range with a single manual control.

The present invention, in accordance with one embodiment thereof, provides a digital display and a manual control having a plurality of tactile detents, the control being coupled to the display through a control unit, the latter serving to sense movement of the manual control from one detent to the next and update the display in accordance with the direction and the speed of movement of the control between successive detents. The control unit includes a counter which is preset to a predetermined value and then decremented at a fixed rate until a detent is detected or until the counter reaches a value representative of one least-significant unit of the display. Upon sensing movement of the control between detents, the control unit serves to add or subtract (depending on the direction of movement of the manual control clockwise or counterclockwise) the then current contents of the counter to the digital display field. The counter is then preset again to the predetermined value and again decremented at the fixed rate, thereby conditioning the control unit for sensing the next movement of the manual control between detents.

While the invention is set forth with particularity in the appended claims, other objects, features, the organization and method of operation of the instant invention will become more apparent, and the invention will best be understood by referring to the following detailed description in conjunction with the accompanying drawing in which:

Figure 1:
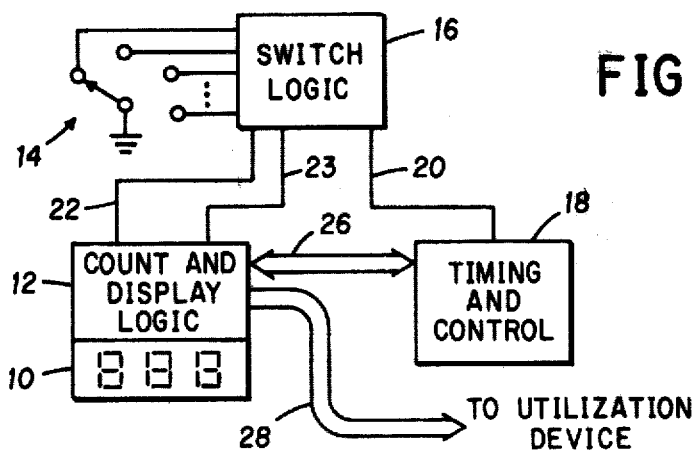
FIG. 1 is a generalized block diagram showing a circuit embodiment of the invention.
Figure 4A:
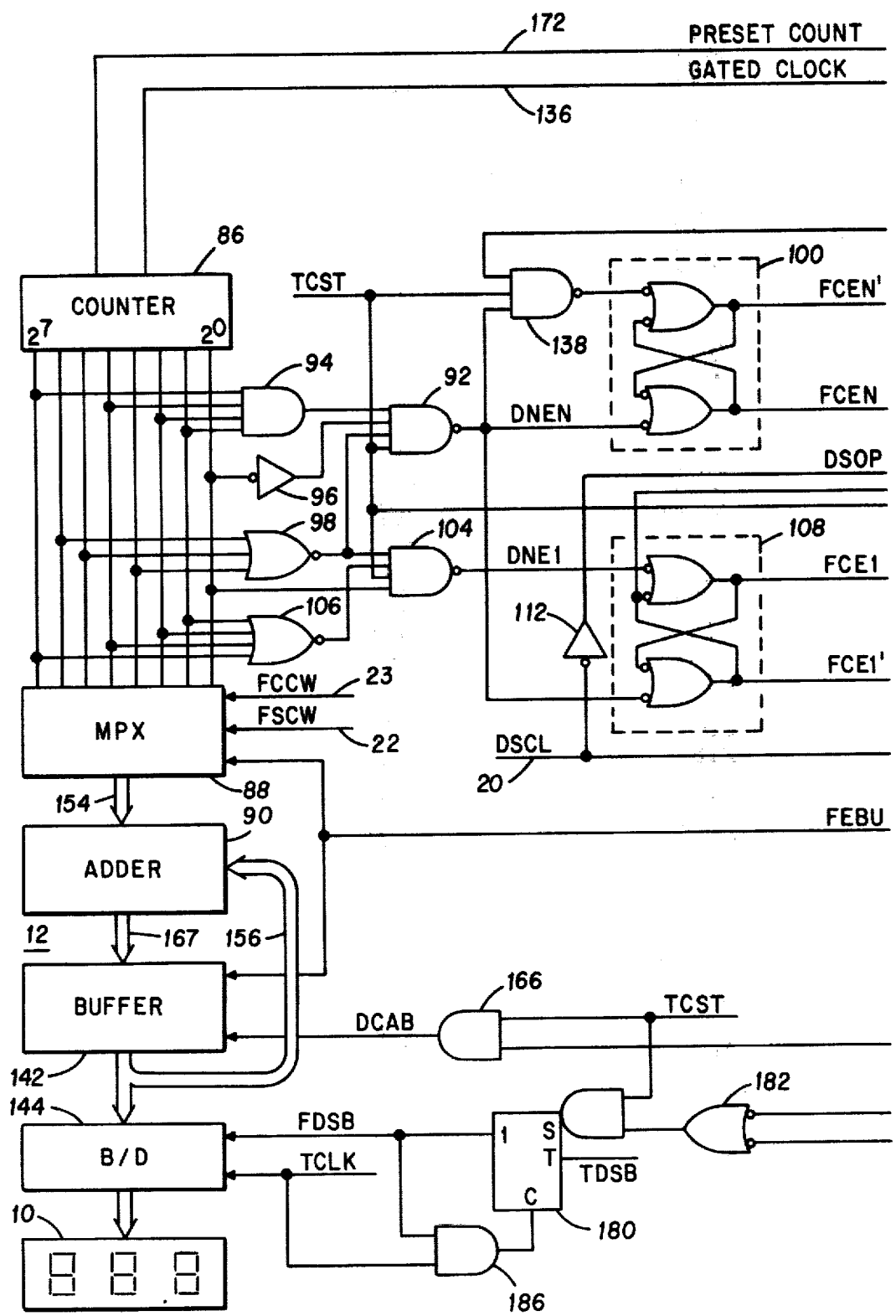
Figure 4B:
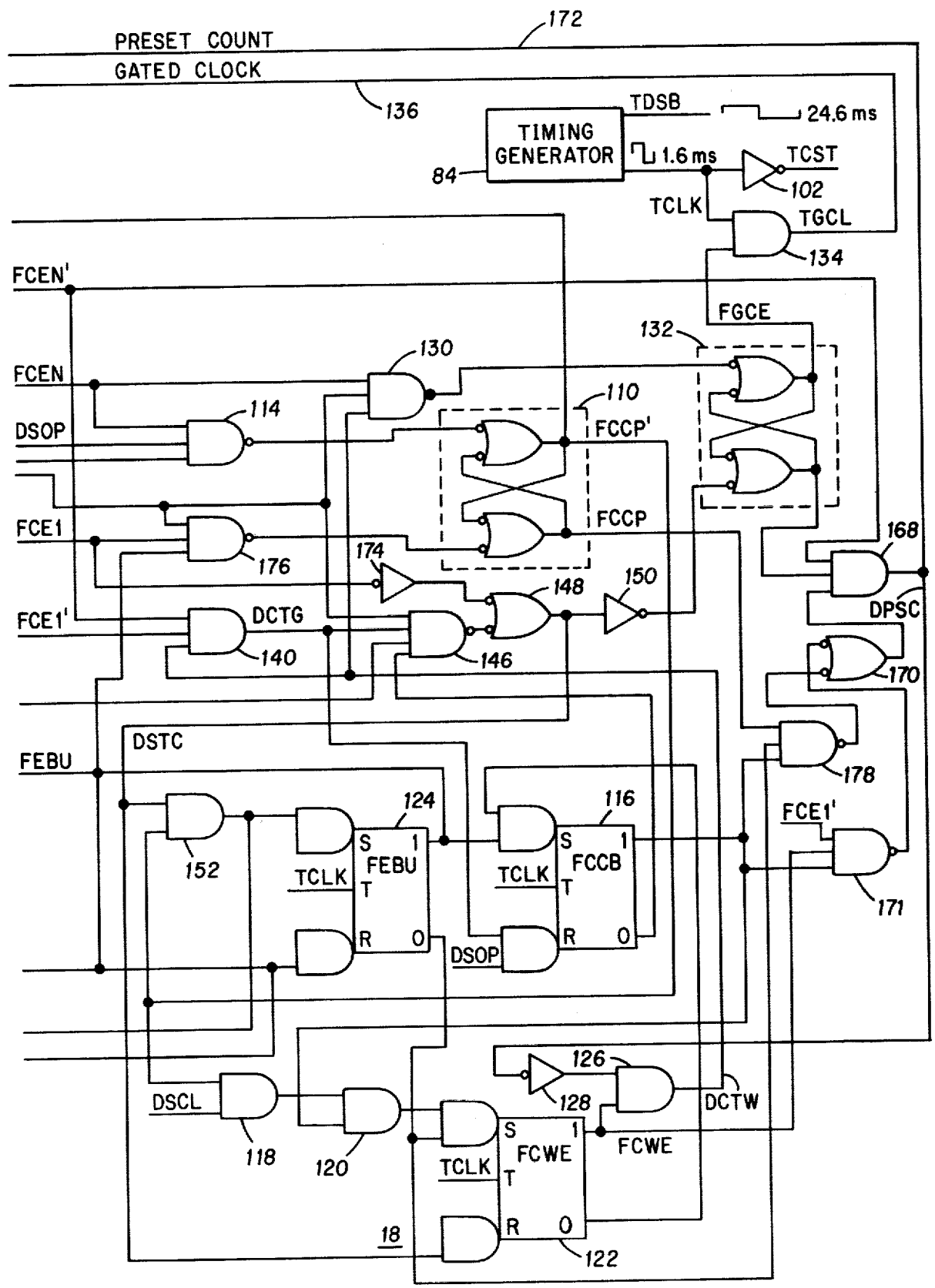

FIGS. 4A and 4B, when arranged side by side, form a logic diagram of the control circuits of FIG. 1.

Figure 5:
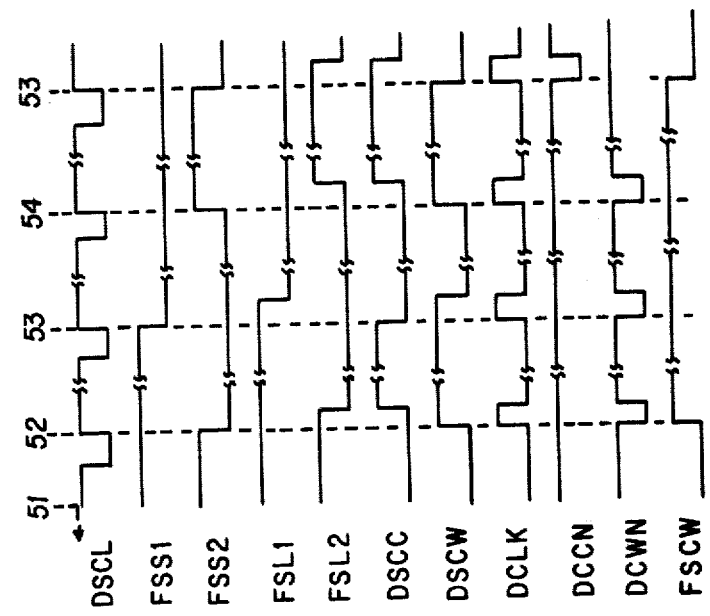
Figure 6:
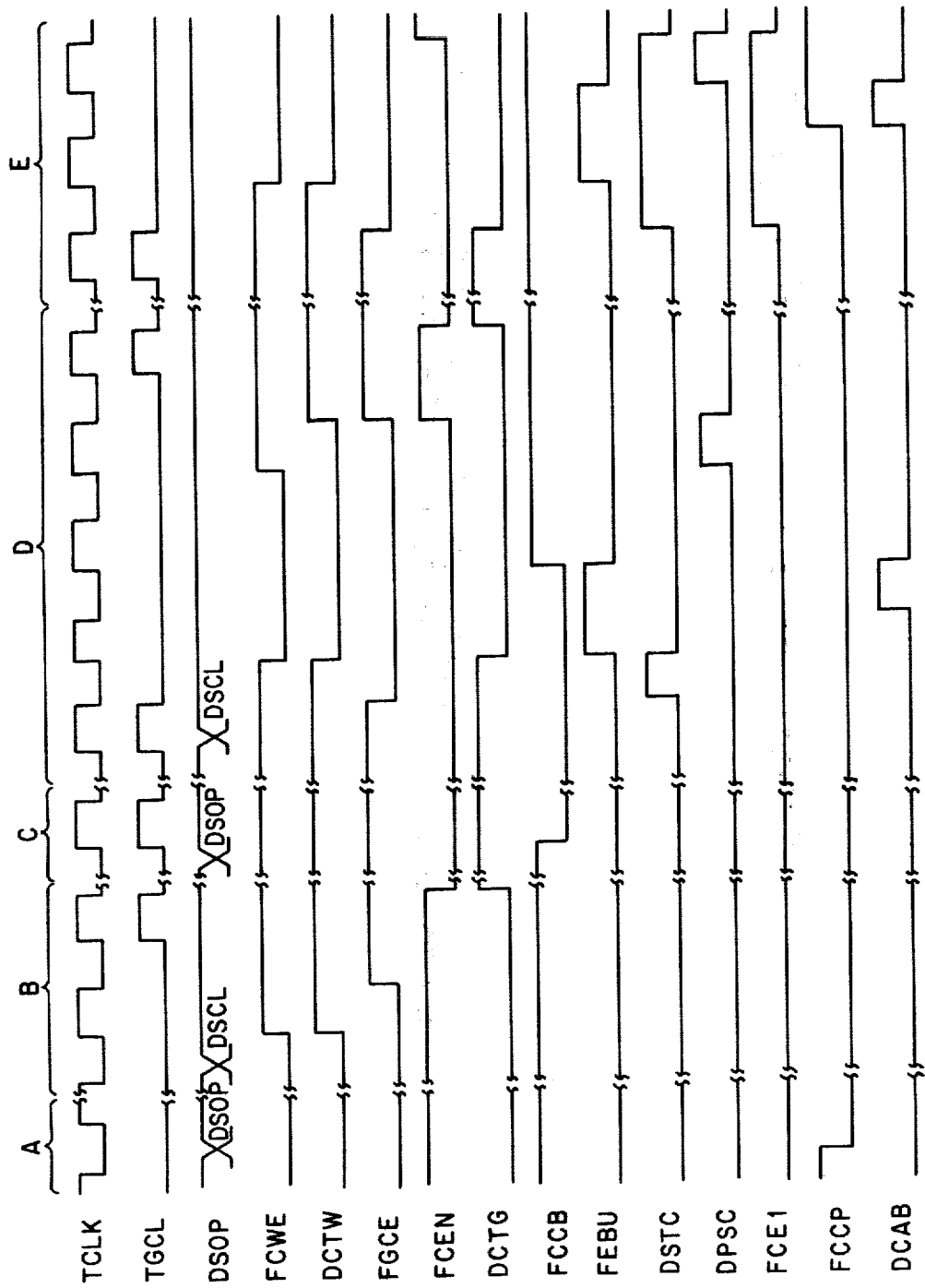

FIGS. 5 and 6 are timing diagrams showing signal wave forms generated by the circuit embodiment of the present invention.

Figure 7:
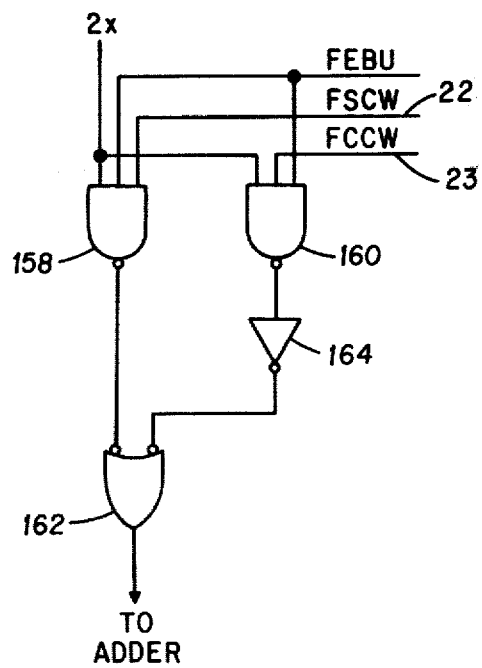

FIG. 7 is a detailed logic diagram of a typical multiplexer circuit shown in block form in FIG. 4.

Figure 8:
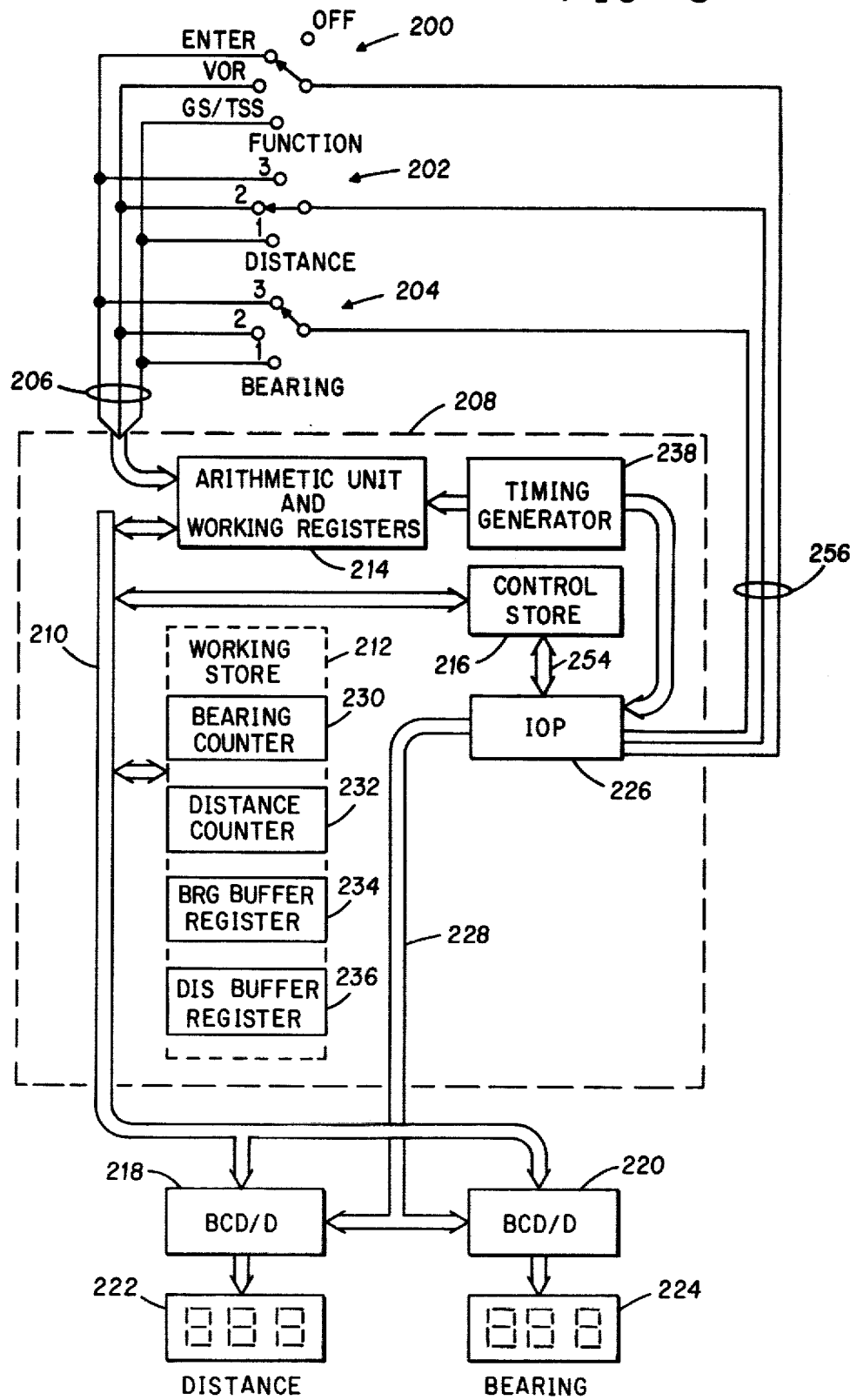

FIG. 8 is a block diagram of a microprocessor embodiment of the instant invention.

Figure 9:
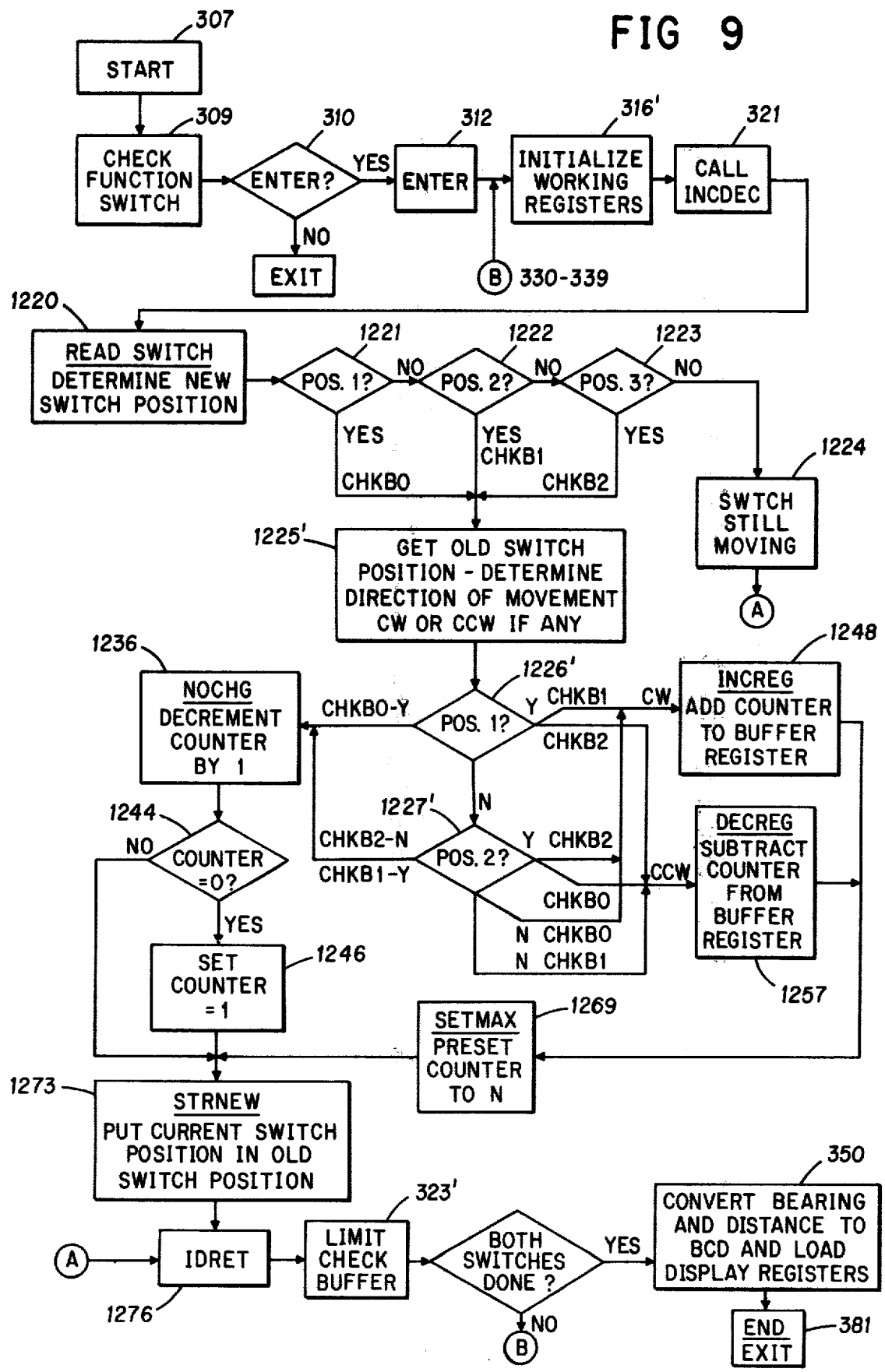

FIG. 9 comprises a flow chart indicating the principle steps executed by typical firmware control elements implementing the instant invention.

DESCRIPTION OF THE PREFERRED EMBODIMENT

Referring now to the various views of the drawing for a more detailed description of the construction, operation, and other features of the invention by characters of reference, FIG. 1 shows a simplified block diagram of one embodiment of the present invention, wherein a numberic digital display 10 and a count & display logic 12 associated therewith are coupled to a manually operable switch 14 via switch logic 16. The switch 14 may be, for example, a rotary switch or other manual control having a plurality of detents or stops, each connected to the switch logic 16. The switch logic 16 detects movement of the switch 14 and supplies a signal representative thereof to timing & control logic 18 via a lead 20. Signals representative of the direction of rotation of the switch 14 are supplied by the switch logic 16 to the count & display logic 12 via signal leads 22, 23. The timing and control logic 18 generates control signals and timing pulses for controlling the operation of the count and display logic 12 via a signal bus 26, while receiving feedback signals from the count & display logic 12 via the bus 26. Data signals representative of the displayed number 10 may be transferred via a data bus 28 to a utilization device (not shown) which may be, for example, a frequency synthesizer should the display 10 represent a radio frequency, or range gate circuits should the display 10 represent a distance.

Figure 2:
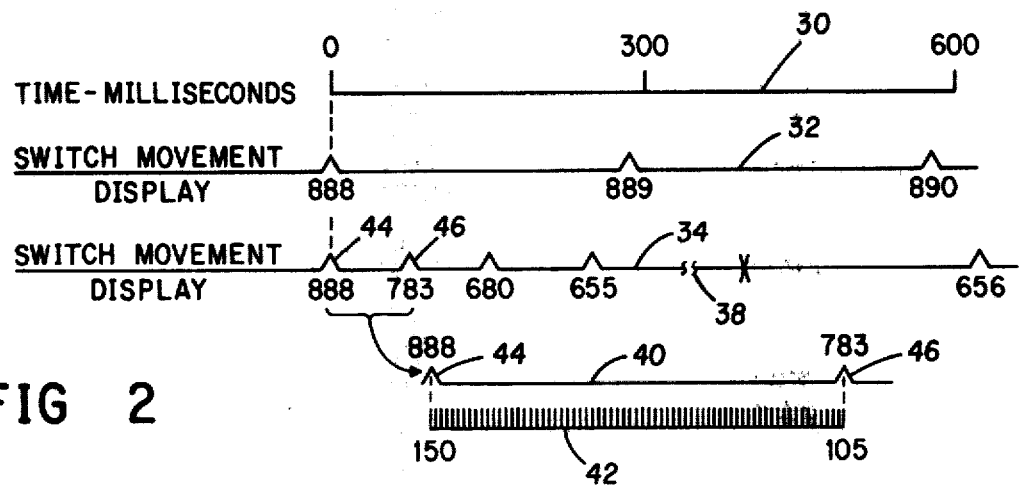
FIG. 2 is a timing diagram illustrating operation of the present invention.

Operation of the variable rate data entry display apparatus of FIG. 1 is illustrated diagrammatically in FIG. 2. A linear scale 30 represents the passage of time, left to right, from 0 to 600 milliseconds. A corresponding scale 32 represents movement of the switch 14 at a rate which results in a minimum change of the display 10; successive indicia of the scale 32 represent movement of the switch 14 between successive adjacent detents in a first direction, the displayed number corresponding with each switch movement being shown below the scale 32 for each indicum. It is evident from the scale 32 that relatively slow movement of the switch between detents, i.e., about 240 milliseconds or more between detents in the presently described illustrative embodiment, causes the display 10 to be incremented by 1 for each detent. Thus, the scale 32 represents movement of the switch two detents, changing the display from 888 to 890. Another scale 34 represents a higher and variable data entry rate which accompanies rapid movement of the switch 14. In the example illustrated by the scale 34, the initial display, 888, was changed to a desired display of 656 by moving the switch 14 four detents, three in the first direction and one in the opposite direction to increment the display by 1. The indicium X on the scale 34 represents a change of direction of switch 14 movement. A discontinuity 38 of the scale 34 is included to account for a time period wherein the operator views the number 655 on the display 10, relizes that the display has decremented past the desired number, and subsequently reacts by moving the switch 14 in the opposite direction thereby incrementing the display 10 to 656.

A portion 40 of the scale 34 is expanded in FIG. 2 to illustrate the relatively fast rate of switch operation and the manner in which the display is incremented. Movement of the switch to a first detent represented diagrammatically by reference number 44, initiates the decrementing of a counter which was preset to a predetermined count of 150; continued movement of the switch to a second detent 46 during a period of time in which the counter counts down to 105, causes that count to be subtracted from (or added to, depending on the direction of switch movement) the displayed number, the resulting number in this instance being 783. Further rapid movement of the switch as represented on the scale 34 causes the displayed number to be changed successively to 680 and 655, the latter change overshooting the desired final setting by 1. Accordingly, the switch was actuated in the opposite direction one detent in order to increase the count by 1 to 656. The variable rate data entry apparatus of the instant invention allows a count resolution of one least significant unit and is completely flexible with regard to the number to which the counter is preset and to the rate of count. The selected values are dependent upon the dynamic characteristics of the switch, viz., stiffness, degrees per detent, knob size, as well as the range of numbers to be displayed. It is apparent from the illustrative diagram of FIG. 2 that the display 10 may be incremented by several least significant units or by several hundred units within essentially the same period of time.

Before proceeding, it is believed desirable to explain conventions utilized in the detailed description. The names and conditions of logic elements described herein are generally as defined in the *IFIP-ICC Vocabulary of Information Processing*, published in 1966 by North-Holland Publishing Company, Amsterdam. The terms "gate" and "logic element" are used interchangeably. Details of the operation of the logic elements described herein may be found in *Electronic Digital Components and Circuits* by R. K. Richards, published in 1967 by D. Van Nostrand Company, Inc. Mnemonic designations descriptive of circuit operation and functions are assigned to the logic-signal and pulse outputs of the various logic elements, as set forth in Table 1 below. The initial letter of each mnemonic is further descriptive of the circuit type, viz: D, signifies a logic element or driver; F, a bistable element or flip-flop; and T, a timing signal or pulse driver.

TABLE 1

| Mnemonic | Signal Name |
| --- | --- |
| DCAB | Clock Adder Into Buffer |
| DCTG | Counting |
| DCTW | Count Window |
| DNE1 | Count $\neq$ 1 |
| DNEN | Count $\neq$ N |
| DPSC | Preset Counter |
| DSCC | Steering Signal CCW |
| DSCL | Switch Closed |
| DSCW | Steering Signal CW |
| DSϕP | Switch Open |
| DSTC | Stop Counting |
| FCCB | Control Bistable |
| FCCP | Count Complete |
| FCE1 | Count = 1 |
| FCEN | Count = N |
| FCWE | Count Window Enable |
| FDSB | Display Buffer |
| FEBU | Enable Buffer Update |
| FGCE | Gated Clock Enable |
| FSL1-2 | Switch State Latches |
| FSS1-2 | Switch State Bistables |
| TCLK | Clock 1.6 ms |
| TCST | Counter Stable |
| TDSB | Display Buffer |
| TGCL | Gated Clock |

Figure 3:
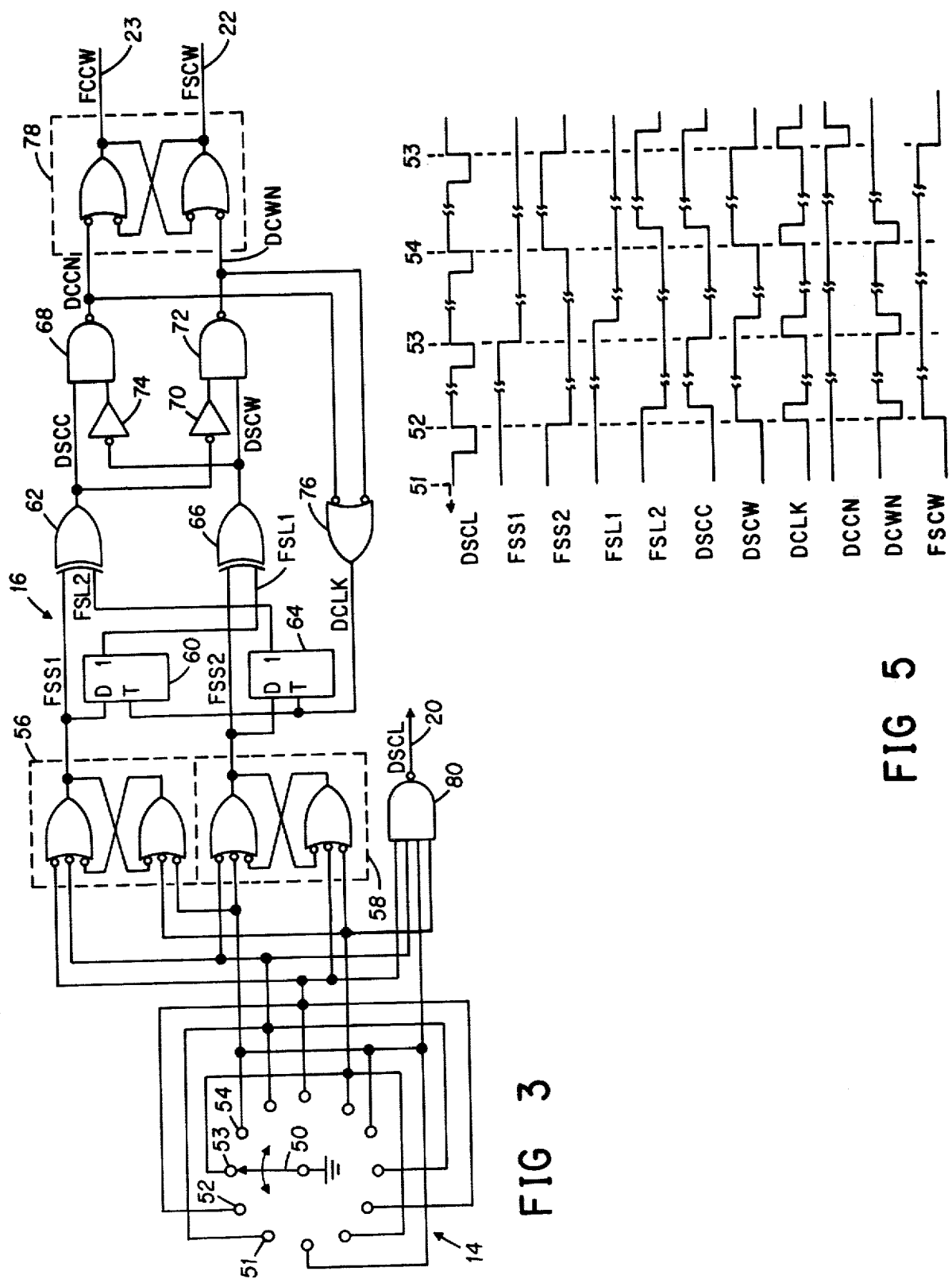
FIG. 3 is a logic diagram of the switch logic of FIG. 1.

The variable rate data entry apparatus of FIG. 1 is shown in greater detail in FIGS. 3 and 4. Referring to FIG. 3, the switch 14 is shown as a 12 position rotary switch having a central wiper 50 and four primary contacts or detents 51, 52, 53, 54, each connected to the fourth successive detent in either direction. The switch 14 arrangement thus provides, in effect, a four position switch having 30 degrees of movement between detents. The first contact set 51 of the switch 14 is connected to an enabling input of each of two switch-state bistables 56, 58. The second contact 52 is connected to the enabling input of the first switch-state bistable 56 and to the disable input of the second switch state bistable 58. Similarly, the third contact 53 of switch 14 is connected to the disable input of both switch-state bistables 56, 68, and the fourth contact 54 is connected to the distable input of the first switch-state bistable 56 and the enabling input of the second switch-state bistable 58. Output signals FSS1 and FSS2 of the bistables 56, 58 thus are representative of the position of the wiper 50 with respect to the four primary contacts or detents 51, 52, 53, 54. The FSS1 signal is connected to an enabling input of a first switch-latch bistable 60 and as one input of an EXCLUSIVE OR logic element 62. The FSS2 signal is connected to an enabling or set input of a second switch-state bistable 64 and as one input of an EXCLUSIVE OR logic element 66. The set or "1" outputs of the FSL1 bistable 60 and the FSL2 bistable 64 are connected as a second input, respectively, of the EXCLUSIVE OR logic elements 66, 62. The output of EXCLUSIVE OR gate 62 is a steering signal DSCC connected as an input of a NAND logic element 68, and through a NOT logic element or inverter 70 as an input of a NAND logic element 72. The output of the EXCLUSIVE OR gate 66 a DSCW signal connected as a second input of the NAND logic element 72 and through an inverter 74 as a second input of the NAND logic element 68. Output signals DCCN of NAND gate 68 and DCWN of NAND gate 72 are connected as inputs of a NOR logic element 76, the output of which is a clock signal DCLK connected to the trigger inputs of the FSL1-2 bistables 60, 64. The DCLK signal clocks the FSS1 and FSS2 signals into the corresponding latch bistable 60, 64. The DCCN signal enables a switch-direction bistable 78 to generate a FCCW signal on signal lead 23; the DCWN signal enables the switch-direction bistable 78 to generate a FSCW signal on lead 22. Each of the four terminal sets 51, 52, 53, 54 of the switch 14 is connected to a NAND logic element 80, the output of which is a switch-closed signal DSCL on lead 20. A timing diagram illustrating the operation of the switch 14 and the switch logic 16 is shown in FIG. 5. The position of the wiper 50 is indicated across the top of FIG. 5 by the reference numbers associated with the primary terminals 51, 52, 53, 54 of switch 14; FIG. 5 depicts the various signals of the switch logic 16 as the wiper 50 is rotated clockwise from the first contact 51 successively through the intermediate contacts 52, 53, to the fourth contact 54, then counter clockwise back to the third contact 53. The DSCL signal is representative of the event of switch movement; the FSCW signal is representative of the direction of switch 14 movement.

Referring now to composite FIG. 4, the count & display logic 12 and the timing & control logic 18 of the FIG. 1 are shown in greater detail. The description of the circuits of FIG. 4 will be augmented by reference to the timing diagram of FIG. 6. A timing generator 84 which may be, for example, a conventional oscillator, pulse shaper and divider circuits, produces a first timing signal TCLK having a duration of 1.6 milliseconds. The timing generator 84 produces a second timing signal TDSB having a duration of 24.6 milliseconds. The TDSB and TCKL timing signals are free running. A counter 86 which in the presently described embodiment is a conventional binary counter having output signals $2^0$ through $2^7$ is connected through a multiplexer 88 to an adder 90. The counter 86 output signals $2^0$-$2^7$ are decoded by a NAND logic element 92 having as inputs thereto an AND logic element 94, a NOT logic element or inverter 96 and a NOR logic element 98. When enabled, the NAND gate 92 generates a signal DNEN which triggers a bistable 100. The NAND gate 92 detects a count of $226_8$ ($150_{10}$) which in the presently described embodiment is a preselected count value to which the counter 80 is preset as described hereinafter. An inverter 102 generates a timing signal TCST which is the inverse of the TCLK timing signal and is utilized to enable the NAND gate 92 at a time when the counter 86 outputs are stable. The bistable 100 generates a signal FCEN, counter=N, when the counter 86 is preset to the predetermined count N or $226_8$. When the counter 86 output signals $2^0$-$2^7$ equal 001, a NAND gate 104 is enabled by the TCST clock signal and inputs from the NOR gate 98, a NOR gate 106, and the $2^0$ signal lead to generate a DNE1 signal which triggers a bistable 108. The bistable 108 thus generates a signal FCE1, counter=1, when the counter 86 outputs are $001_8$.

In order to facilitate further description of the circuits of FIG. 4, it is assumed that initial conditions of the various logic signals of FIG. 4 are as shown in the FIG. 6 timing diagram, under the bracket bearing reference character A. The rotary switch 14 is initially dormant, the wiper 50 resting on one of the detents; consequently, the DSCL signal on the lead 20 is enabled or "high" indicating that the switch is closed. The FCEN signal output of the bistable 100 is high indicating the counter 86 output is preset to N. A bistable 110 is initially enabled to generate a signal FCCP indicating that the counter 86 had counted down to 1 during the previous operation of the switch 14. The manner in which the FCCP bistable 110 is enabled will be explained later.

The counter 86 remains preset to N (FCEN high) until the switch is moved to another detent. When the switch 14 is opened, the DSCL signal on the lead 20 goes low generating a DSOP switch-open signal from an inverter 112. The DSOP signal is connected as one input of a NAND gate 114. The NAND gate 114 is enabled by the FCEN signal count=N and the reset output of the FCE1 bistable 108 (count≠1) to trigger the resetting of the count-complete bistable 110. A control bistable 116 is initially enabled or set as will be described hereinafter. Referring still to FIG. 4 and the timing diagram of FIG. 6B, the switch 14 is closed on the first detent from the dormant position enabling the DSCL signal. The DSCL signal enables an AND gate 118 which was conditioned by the FCCP' signal when the FCCP bistable 110 was reset. The output of the AND gate 118 is coupled via an AND gate 120 to the set input of a bistable 122. The AND gate 120 receives a second input from the "1" output of the FCCB bistable 116. The set input of the bistable 122 is enabled by the output signal of the AND gate 120 and a high signal from the "0" output of an FEBU bistable 124. Upon the occurrence of a rising edge of the TCLK clock signal at the "T" input of the bistable 122, the bistable 122 sets and the FCWE count-window-enable signal is generated at the "1" output thereof. The FCWE signal is coupled to one input of an AND logic element 126, a second enabling input of the AND gate 126 being the complement of a DPSC signal coupled thereto via an inverter 128. The output of the AND gate 126 is a DCTW count-window signal which is connected as one input of a NAND logic element 130. The FCEN signal output of the bistable 100 is connected as a second enabling input to the NAND logic element 130; upon the ocurrence of a TCST clock signal, the NAND gate 130 is enabled to trigger a bistable 132 the output of which is an FGCE gated-clock-enabled signal connected as one input of an AND gate 134. The TCLK free-running clock signal from the timing generator 84 is connected as a second input of the AND gate 134; thus, the FGCE signal enables the AND gate 134 to generate a TGCL gated-clock signal which is connected via a signal lead 136 to the binary counter 86. Upon the occurrence of the first TGCL gated-clock signal as described with reference to FIG. 6B the counter 86 counts down from N ($226_8$) to N-1 ($225_8$) thus disabling the NAND element 92 the output of which remains high as the DNEN count≠N signal. The DNEN signal is coupled as one input to a NAND gate 138, another input thereto being the FCCP' signal output of the bistable 110. Upon occurrence of the TCST clock signal, the NAND gate 138 is enabled to reset the FCEN bistable 100. The FCEN' signal, the FCE1' signal ("0" output of the bistable 108), and the DCTW signal are connected as inputs of an AND gate 140, the output of which is a DCTG signal. The DCTG signal is enabled during the period when the counter 86 is counting down and generating output signals on lines $2^0$-$2^7$ having values between N and 1. The DCTG signal is coupled to the reset input of the control bistable 116 to condition the resetting thereof upon opening the switch 14 while the counter 86 is counting. The latter described event is depicted diagrammatically in FIG. 6C.

Referring now to FIG. 4 and FIG. 6D, the operation of the instant embodiment of the invention is described wherein the switch 14 is closed on a second detent from the dormant position indicating relatively fast movement of the switch to achieve a correspondingly high rate of data entry. A storage buffer 142 stores a quantity which is periodically displayed in the display unit 10 under control of the TDSB timing signal. Binary-to-decimal display conversion circuits 144 convert the binary signals stored in the buffer 142 to decimal-segment driving signals utilized by the display 10 in a manner well known in the art. During the time period depicted in FIG. 6D the buffer 142 is updated by adding or subtracting the contents of counter 86 to the buffer 142, the counter 86 is again preset to N, and countdown restarted. A NAND logic element 146 having as its inputs the DSCL, DCTG, FCCB' and DCST signals is enabled upon occurrence of the first TCST timing signal after closing the switch 14. The NAND logic element 146 being enabled, in turn enables a NOR logic element 148 which generates a DSTC stop-counting signal. The DSTC signal triggers the resetting of the FGCE bistable 132 via an inverter 150, thereby inhibiting generation of the TGCL gated clock signal. The DSTC signal is also coupled to the set input of the FEBU bistable 124 via an AND gate 152. The setting of the FEBU bistable 124 is inhibited by the FCCP count-complete signal, implemented by connecting the FCCP' output of the bistable 110 to one input of the AND gate 152. The DSTC signal is coupled also to the reset input of the FCWE bistable 122; upon occurrence of the first TCLK clock signal after generation of the DSTC signal, bistable FEBU 124 sets and bistable FCWE 122 resets. Concurrently with the resetting of the FCWE bistable 122, the AND gate 126 is disabled and the DCTW count-window signal goes low; in turn, the DCTG signal output of the AND gate 140 is disabled. The enabled output of the FEBU bistable 124 is connected to its own reset input; consequently, the FEBU bistable 124 remains set for one period of the TCLK clock signal. The enabled output of the FEBU bistable 124 is connected also to the multiplexer circuits 88 and the storage buffer 142. The FEBU signal serves to gate the output signals from the counter 86 to a first input of the adder 90 via a bus 154, and to gate the contents of the storage buffer 142 via a bus 156 to a second input of the adder 90. Referring momentarily to FIG. 7, a typical stage of the multiplexer circuits 88 transferring one bit of the counter 86 output to the adder is shown. The FEBU signal is connected as one input to each of the two NAND logic elements 158, 160. Each NAND gate 158, 160 receives data input from the counter via a signal lead labeled $2^X$ where X equals 1-7. The NAND gate 158 receives as its third input the FSCW signal via the signal lead 22 from the switch logic 16 (see FIGS. 1, 4); the NAND gate 160 receives as its third input the FCCW signal via the signal lead 23. The outputs of both NAND gates 158, 160 are coupled to a NOR logic element 162, the NAND gate 158 directly, and the NAND gate 160 via an inverter 164. Thus when the switch 14 (FIG. 1) is operated clockwise, NAND gate 158 is enabled to gate the counter data signals directly to the adder via the NOR element 162; when the switch 14 is operated counterclockwise, the NAND gate 160 is enabled by the FCCW signal thereby enabling the complement of the data signal to the adder via the inverter 164 and the NOR gate 162. The $2^0$ stage of the multiplexer circuits (not shown) is an atypical circuit in that the inverter element 164 is omitted, the output of NAND gate 160 being coupled directly to the NOR gate 162. Elimination of the inverter 164 in the $2^0$ stage of the multiplexer circuits effectively adds 1 to the complemented data output of the counter 86, thus supplying the ones complement of the counter output to the adder 90 to effectuate a subtraction operation.

Returning now to FIGS. 4 and 6D, the FEBU enable-buffer-update signal is coupled to an AND gate 166 which, at TCST time, generates a signal DCAB which is coupled to the buffer 142 and serves to clock the output signals of the adder 90 appearing on a signal bus 167 into the buffer 142 storage elements. Upon occurrence of the next TCLK clock signal, the FEBU bistable 124 resets and the FCCB control bistable 116 sets. The set input of the FCCB bistable is enabled by the "1" output of the FEBU bistable 124 and the "0" output of the FCWE bistable 122. With the FCCB bistable 116 set and the FEBU bistable 124 reset, the FCWE bistable 122 is enabled for setting on the next subsequent TCLK clock signal. Upon setting of the FCWE bistable 122, and AND gate 168 is enabled to generate the DPSC preset-count signal via a NOR gate 170 and a NAND logic element 171. The NAND gate 171 is enabled by the FCWE and FCCB signals, and by the reset output of the FCE1 bistable 108. The AND gate 168 is enabled by the reset output of the FCEN bistable 100 and by the reset output of the FGCE bistable 132. The DPSC preset-count signal which is coupled via a signal line 172 to the counter 86, serves to preset the counter 86 to a predetermined output count which in the presently described embodiment is $150_{10}$. When the counter 86 is preset to N, the decode logic comprising the logic elements 92, 94, 96, 98, previously described, triggers the FCEN bistable 100 to disable the FCEN' signal thus disabling the AND gate 168. The DPSC signal going low enables the AND gate 126 as previously described to generate the DCTW count-window signal, which in turn enables the NAND gate 130 to trigger the FGCE bistable 132.

The circuit description with reference to FIG. 6D, immediately preceding, assumed that the switch 14 was being operated in the relatively fast mode; the switch was closed while counting was still in progress, the buffer was updated, the counter preset to N, and the countdown restarted. Referring now to FIG. 4 in conjunction with FIG. 6E, it is assumed that the switch remains closed until the counter counts down to 1. When the switch remains dormant, i.e., closed for a period of time which is sufficient to allow the counter 86 to count down to 1, slow movement of the switch as previously described with reference to FIG. 2 is indicated. During the slow mode of operation and upon the counter reaching a count of 1, the buffer 86 is incremented or decremented by 1 depending on the direction of rotation of the switch, and the counter is again preset to N. The counter then remains preset to N until the switch is moved to another detent. Upon the counter 86 reaching a count of 1, the decode logic comprising the logic elements 104, 98, 106 triggers the FCE1 bistable 108. The FCE1 signal coupled to the input of the NOR gate 148 via an inverter 174, enables the NOR gate 148 to generate the DSCT stop-counting signal. The DSCT signal triggers the resetting of the FGCE bistable 132, and upon the occurrence of the next subsequent TCLK clock signal, enables setting of the FEBU bistable 124 and resetting of the FCWE bistable 122. Concurrently with the resetting of the FCWE bistable 122, the AND gate 126 is disabled, which in turn inhibits the AND gate 130 from triggering the FGCE bistable 132 until the next subsequent movement of the switch 14. A NAND logic element 176 is enabled by the FCE1 signal, the FEBI signal and the TCST timing signal to trigger the FCCP count-complete bistable 110. During the period when the FEBI bistable 124 is set, the buffer 142 is again updated as previously described with reference to FIG. 6D. When the FEBU bistable resets upon occurrence of the next subsequent TCLK lock signal, the "0" output thereof along with the FCCP signal and the FCCB signal enable a NAND logic element 178. The NAND gate 178 enables the AND gate 168 via the NOR gate 170 to generate the DPSC signal which, as previously described, serves to preset the counter 86 to the predetermined count N. Upon detecting the predetermined count, the FCE1 bistable 108 resets, the FCEN bistable 100 sets, and the DPSC and DSTC signals are disabled. The circuits of FIG. 4 as described immediately preceding with reference to FIG. 6E are now in the condition previously referred to with reference to FIG. 6A as the initial or dormant condition.

Referring still to FIG. 4, a bistable 180 is enabled by the TCST timing signal and triggered by TDSB timing signal to generate an FDSB display-buffer signal which is connected to the binary-to-decimal converter 144. The set input of the FDSB bistable 180 is inhibited by an input from a NOR logic element 182. The NOR gate 182 is enabled when the FEBU bistable 124 is reset or the AND gate 152, the enabling input of the FEBU bistable 124, is low. The inhibit input generated by the NOR gate 182 prevents the buffer 142 from being displayed while the buffer 142 is being updated. On the first TCLK clock signal after setting the FDSB bistable 180, an AND gate 186 generates a signal which clears the FDSB bistable 180.

The timing constants represented by the TDSB display-buffer signal and the TCLK clock signal in the preceding description are arbitrary and may be determined empirically depending on the particular application and implementation of the present invention.

An alternate embodiment of the variable rate data entry apparatus of the present invention is shown in FIG. 8. The contacts of a function switch 200, a distance switch 202, and a bearing switch 204 are connected via a common input bus 206 to a microprocessor 208. The microprocessor 208 comprises a signal bus 210 interconnecting the various units of the microprocessor 208 including a working store 212, arithmetic unit & working registers 214, and a control store 216. Coupled to the microprocessor 208 via the signal bus 210 are a pair of binary-coded-decimal to 7-segment digit decoder/drivers 218, 220. The decoder/driver 218 drives a distance display unit 222; the decoder/driver 220, a bearing display unit 224. The display units 222, 224 may use, for example, light-emitting diodes (LED). An input/output processor (IOP) 226 generates control signals which are coupled to the decoder/drivers 218, 220 via a control bus 228 which control signals serve to control the display of distance and bearing data supplied to the decoder/drivers 218, 220 via the signal bus 210 from the working store 212. Working store 212 cells labeled BEARING COUNTER 230 and DISTANCE COUNTER 232 correspond functionally with the counter 86 of the embodiment previously described with reference to FIG. 4. Similarly, the working store 212 cells labeled BRG BUFFER REGISTER 234 and DIS BUFFER REGISTER 236 correspond functionally with the buffer 142 of the FIG. 4 embodiment. The control store 216 contains permanently recorded therein a machine coded program segment comprising an ordered instruction set which controls the operation of the microprocessor 208 in response to microprocessor 208 inputs from the switches 200, 202, 204. In order to achieve a meaningful and orderly progression of program steps involved in inputting display data at a variable rate and the attendant movement of information signals and data among the various units, registers, and other elements of the microprocessor 208, after a need for specific movements, combinations of movements, and operations has been established, control signals and timing pulses must be generated or issued to permit the prescribed movement or operation at the desired time. Any undesirable movements or operations must likewise be inhibited. The exact manner in which specific control signals are logically derived and timing pulses generated from a clock source (such as timing generator 238), delay network or divider according to precisely defined conditions within the microprocessor 208 at certain precisely defined times has become a matter of common knowledge within the art. Consequently, in the ensuing discussion, no attempt is made to describe in detail the operation of the microprocessor 208 circuits or the specific origin of each of the control signals and timing pulses which bring about the information movements or effectuate operations within microprocessor 208. Reference may be made to the technical publications of the manufacturers of commercially available microprocessor products. The presently described embodiment of the invention was implemented utilizing a type 8035 CPU and a type 8355 ROM I/O manufactured by the Intel Corporation.

The operation of the instant embodiment of the invention is most conveniently described with reference to the flow chart of FIG. 9 in conjunction with the program segment listing below, written in the ISIS-II Macro Assembler Language.

| | | | Program Listing |
|---|---|---|---|
| Seq. | Source | Statement | Comments |
| 307 | | JUMP TO ROUTINE FOR ENTR, VOR, OR GS/TTS MODE | |
| 308 | | | |
| 309 | MOV | A,R3 | ; CHECK FUNCTION SWITCH |
| 310 | JBφ | ENTER | |
| 311 | JMP | NOENT | |
| 312 ENTER | MOV | Rφ,#OLDSW | |
| 313; | | | |
| 314; | | INCREMENT OR DECREMENT DISTANCE-FROM SWITCH POSITION | |
| 315; | | | |
| 316 | MOV | A,@Rφ | ; GET OLD SWITCH POSITION IN ACC |
| 317 | MOV | R3,A | ; PUT OLD POSITION IN R3 |
| 318 | MOV | Rφ,#WPTDIS | |
| 319 | MOV | R1,#DISCTR | |
| 320 | MOV | R2,#HIGH(DSCTMX) | |
| 321 | CALL | INCDEC | ; CHECK DISTANCE SWITCH FOR INCR OR DECR |
| 322; | | | |

-continued

Program Listing

| Seq. | Source | Statement | Comments |
|---|---|---|---|
| 323; | LIMIT CHECK DISTANCE: | | φ LE DIST LT 2φφ |
| 324; | | | |
| 325 | MOV | Rφ,#WPTDIS+1 | ; ADDRESS OF HIGH ORDER BYTE |
| 326 | CALL | CHK2φφ | ; LIMIT CHECK DISTANCE GE φ AND LT 2φφ |
| 327; | | | |
| 328; | INCREMENT OR DECREMENT BEARING-FROM SWITCH POSITION | | |
| 329; | | | |
| 330 BRGSW | MOV | Rφ,#WPTBRG | |
| 331 | MOV | R1,#BRGCTR | |
| 332 | MOV | R2,#HIGH(BGCTMX);LOAD R2 WITH MAXIMUM VALUE OF BRG CTR | |
| 333 | MOV | A,R3 | ; SWAP BYTES IN SWITCH REGISTERS |
| 334 | SWAP | A | |
| 335 | MOV | R3,A | |
| 336 | MOV | A,R4 | |
| 337 | SWAP | A | |
| 338 | MOV | R4,A | |
| 339 | CALL | INCDEC | |
| 340; | | | |
| 341; | LIMIT CHECK BEARING | | φ LE BRG LT 36φ (WITH ROLL-OVER) |
| 342; | | | |
| 343 | MOV | Rφ,#OLDSW | |
| 344 | MOV | A,R3 | |
| 345 | SWAP | A | |
| 346 | MOV | @Rφ,A | |
| 347 | MOV | Rφ#WPTBRG+1 | |
| 348 | CALL | CHK36φ | ; LIMIT CHECK BRG BETWEEN φ and 359 |
| 349; | | | |
| 350 | CONVERT BEARING AND DISTANCE TO BCD AND LOAD DISPLAY REGISTERS | | |
| 351; | | | |
| 352 | MOV | Rφ,#WPTBRG | |
| 353 | MOV | P3,@3φH | ; LOAD 'E' INTO UPPER BYTE FOR DISPLAY |
| 354 | CALL | BINBCD | ; CONVERT WPTBRG TO BCD |
| 355 | MOV | Rφ,#DISBRG | |
| 356 | MOV | @Rφ,A | ; LOAD TWO LSD DIGITS |
| 357 | DEC | Rφ | ; NEXT DISPLAY REGISTER |
| 358 | MOV | A,R3 | |
| 359 | MOV | @Rφ,A | |
| 360 | MOV | Rφ,#WPTDIS | |
| 361 | MOV | R3, #φ | |
| 362 | CALL | BINBCD | ; CONVERT WPTDIS TO BCD |
| 363 | MOV | Rφ,#DISNM | |
| 364 | MOV | @Rφ;A | ; STORE TWO NM DIGITS IN DISPLAY MEMORY |
| 365 | CALL | TST1φφ | ; SET OR RESET 1φφBIT |
| 366 | ANL | A,#NOT(82H) | ; CLEAR GS/TTS MODE AND TURN OFF LAMPS |
| 367 | ORL | A,#5 | ; TURN ON NM AND FROM LAMPS |
| 368 | NOV | @Rφ,A | |
| 369 | INC | Rφ | |
| 370 | NOV | A,@Rφ | ; GET FLAG STATUS WORD |
| 371 | ORL | A,#7 | ; SET ALL FLAGS |
| 372 | CALL | SETDF | ; CALL TO SET DIST FLAG |
| 373 | MOV | Rφ,#CYCLE | ; SET CYCLE COUNTER TO ZERO |
| 374 | MOV | @Rφ,#φ | |
| 375 | ORL | P2,#1OH | ; SET NAV SELECT LINE TO NAV 1 |
| 376 | SEL | RB1 | |
| 377WTLOOP | MOV | A,R7 | ; EXAMINE TIMER EXT TO WAIT IN TIMING LOOP |
| 378 | JZ | WTLOOP | |
| 379 | MOV | R7,#φ | ; RESET TIMER EXT TO φ |
| 380 | SEL | RBφ | ; RETURN TO PRIMARY REGISTER BANK |
| 381 | JMP | NXTCYC | ; END OF PROGRAM CYCLE |
| 1209; | THIS SUBROUTINE (INCDEC) DETERMINES THE DIRECTION OF ROTATION | | |
| 1210; | OF A ROTARY SWITCH AND INCREMENTS OR DECREMENTS THE DISPLAY | | |
| 1211; | REGISTER BY A NUMBER PROPORTIONAL TO THE SPEED OF ROTATION. | | |
| 1212; | THE ADDRESS OF THE NUMBER TO BE INCREMENTED OR DECREMENTED | | |
| 1213; | IS CONTAINED IN Rφ. THE ADDRESS OF THE COUNTER WHICH DETERMINES | | |
| 1214; | THE SPEED IS IN R1. THE PRESET VALUE (MAXIMUM VALUE) OF THE | | |
| 1215; | COUNTER IS IN R2. THE OLD SWITCH POSITION SHOULD BE IN THE | | |
| 1216; | LSN of R3, AND THE NEW SWITCH POSITION SHOULD BE IN THE | | |
| 1217; | LSN OF R4. REGISTERS R4-R7 ARE UNCHANGED. | | |
| 1218; | | | |
| 1219; | | | |
| 1220 INCDEC | MOV | A,R4 | ; GET NEW SWITCH POSITION |
| 1221 | JBφ | CHKBφ | ; SWITCH IS NOW IN POSITION 1 |
| 1222 | JB1 | CHKB1 | ; SWITCH IS NOW IN POSITION 2 |
| 1223 | JB2 | CHKB2 | ; SWITCH IS NOW IN POSITION 3 |
| 1224 | JMP | IDRET | ; SWITCH IS MOVING NO CHANGE |
| 1225CHKBφ | MOV | A,R3 | ; CHECK OLD POSITION |
| 1226 | JBφ | NOCHG | ; STILL IN POSITION 1 |
| 1227 | JB1 | DECREG | ; SWITCH MOVED |
| 1228 | JMP | INCREG | ; SWITCH MOVED. INCR THE REGISTER |
| 1229CHKB1 | MOV | A,R3 | ; GET OLD SWITCH POSITION |

-continued

Program Listing

| Seq. | Source | Statement | Comments |
|---|---|---|---|
| 1230 | JB$\phi$ | INCREG | ; IT MOVED, INCREMENT THE REGISTER |
| 1231 | JB1 | NOCHG | ; IT DID NOT MOVE |
| 1232 | JMP | DECREG | ; IT MOVED, DECR THE REGISTER |
| 1233CHKB2 | MOV | A,R3 | ; GET THE OLD SWITCH POSITION |
| 1234 | JB0 | DECREG | ; IT MOVED, DECR THE REGISTER |
| 1235 | JB1 | INCREG | ; IT MOVED, INCREMENT THE REGISTER |
| 1236NOCHG | MOV | A,@R1 | ; GET THE COUNTER CONTENTS IN ACC |
| 1237 | ADD | A,#-1*64 | ; SUBTRACT ONE COUNT |
| 1238 | MOV | @R1,A | |
| 1239 | INC | R1 | |
| 1240 | MOV | A,@R1 | |
| 1241 | ADDC | A,#$\phi$FFH | |
| 1242 | MOV | @R1,A | |
| 1243 | DEC | R1 | |
| 1244 | ORL | A,@R1 | ; TEST COUNTER FOR ZERO |
| 1245 | JNZ | STRNEW | |
| 1246 | MOV | @R1,#1*64 | ; SET COUNTER TO ONE |
| 1247 | JMP | STRNEW | |
| 1248INCREG | MOV | A,@R$\phi$ | ; ADD THE COUNTER CONTENTS TO THE REGISTER |
| 1249 | ADD | A,@R1 | |
| 1250 | MOV | @R0,A | |
| 1251 | INC | R0 | |
| 1252 | INC | R1 | |
| 1253 | MOV | A,@R$\phi$ | |
| 1254 | ADDC | A,@R1 | |
| 1255 | MOV | @R0,A | |
| 1256 | JMP | SETMAX | ; JMP TO SET COUNTER TO MAX VALUE |
| 1257DECREG | MOV | A,@R$\phi$ | ; SUBTRACT THE COUNTER CONTENTS FROM |
| 1258 | CPL | A | ; THE REGISTER |
| 1259 | ADD | R,@R1 | |
| 1260 | CPL | A | |
| 1261 | MOV | @R$\phi$,A | |
| 1262 | INC | R0 | |
| 1263 | INC | R1 | |
| 1264 | MOV | A,@R$\phi$ | |
| 1265 | CPL | A | |
| 1266 | ADDC | A,@R1 | |
| 1267 | CPL | A | |
| 1268 | MOV | @R$\phi$,A | |
| 1269SETMAX | MOV | A,R2 | ; GET MAXIMUM COUNTER MSB IN ACC |
| 1270 | MOV | @R1,A | ; STORE IN COUNTER |
| 1271 | DEC | R1 | |
| 1272 | MOV | @R1,#$\phi$ | ; SET LSB TO ZERO |
| 1273STRNEW | MOV | R$\phi$,#3 | |
| 1274 | MOV | A,R4 | ; PUT NEW SWITCH POSITION IN R3 LSN |
| 1275 | XCHD | A,@R$\phi$ | |
| 1276IDRET | RET | | |

A convention utilized for describing the program segment of the instant embodiment of the invention assigns reference numbers to the program flow chart blocks of FIG. 9 which correspond with the sequence numbers of the program source statements listed herein. Further, where the flow chart blocks of FIG. 9 represent more than one program portion of the source statement listing, a prime symbol appended to the reference number designates such plural application.

Referring now to FIG. 9 in conjunction with FIG. 8, the flow chart of FIG. 9 is representative of the program segment listing herein, a START block 307 indicating the point at which execution of the program segment is initiated. The position of the function switch 200 determines whether or not data will be entered via the distance and/or bearing switches 202, 204, to update the displays 222, 224; consequently, the initial task of the program segment designated as block 309 checks the position of the function switch 200. The program segment in control store 216 issues appropriate control signals via a signal bus 254 to the IOP 226, the IOP 226, in turn, issues an identifying pulse or strobe via a signal bus 256 to only the wiper of function switch 200. Simultaneously, the arithmetic unit & working registers 214 are conditioned to receive input signals on the bus 206 from whichever one of the switches 200, 202, 204 is connected via the IOP. A decision block 310 of the FIG. 9 flow chart is representative of the test performed on the data signals received from the switch 200 to determine whether or not the function switch 200 is in the ENTER position. The function switch 200 being in the ENTER position, the affirmative path is indicated and the ENTER block 312 is initiated. Execution of the program block 312 initializes the working registers (block 316'), and a program subroutine INCDEC (block 321') is initiated. The INCDEC subroutine is called twice during execution of the ENTER routing, a first time to service the distance switch 202 and a second time to service the bearing switch 204; the INCDEC subroutine services both switches. In a first block 1220 of the INCDEC subroutine, the appropriate input data switch 202, 204 is strobed and the switch position information is stored in working register 4. Position-determining decision block 1221 is entered to determine if the strobed switch is in position 1. If the strobed switch is in position 1, the program control transfers to a CHKBO location of the INCDEC subroutine. If the strobed switch is not in position 1, control passes to a decision block 1222 where a similar test is performed for position 2 of the strobed switch, and similarly to a decision block 1223 for position 3 test. If none of the position tests of the decision blocks 1221, 1222, 1223 are affirmative indicating that the strobed switch is in motion between positions or detents, then a block 1224 is entered transferring program control to a IDRET location 1276 which is the exit or return from the INCDEC subroutine. Assuming one of the position determining blocks 1221, 1222, 1223 is affirmative, program control jumps to 1 to 3 locations, CHKB0, CHKB1, or CHKB2 as determined by the switch position. The program steps of each such location as indicated by representative block 1225 fetch the old switch position from working register R3 and determine in one of two subsequent decision blocks 1226', 1227', whether the new switch position represents a movement from the old switch position and if such movement is indicated whether the direction of movement is clockwise or counterclockwise. If no movement of the switch is detected, program control passes to a location NOCHG 1236; if clockwise movement is detected program control passes to location INCREG 1248, and if counterclockwise movement is detected program control passes to location DECREG 1257. For example, if the new and old switch positions are, respectively, positions 2 and 3, decision block 1222 would be affirmative indicating a program control jump to location CHKB1. Decision block 1226' would be negative passing control to decision block 1227', also negative. The negative determination from decision block 1227 in program portion CHKB1 indicates that the old switch position was position 3, consequently, switch movement was from position 3 to position 2, or counterclockwise, and control passes to program location DECREG 1257. In a second example, the new switch position is position 3; the old, position 2. The decision block 1223 being affirmative indicating position 3, transfers program control to location CHKB2. Program determination of an old switch position 2 generates negative results from decision block 1226' and affirmative from decision block 1227'. The affirmative result from decision block 1227' in the CHKB2 segment indicates clockwise movement of the switch and transfers program control to location INCREG 1248. Program segment portions 1248 and DECREG 1257 initiate updating of the active one of the buffer registers 234, 236 (FIG. 8) by adding thereto or subtracting therefrom the contents of the corresponding counter 230, 232. After updating the buffer register, program control transfer to a location SETMAX 1259 and the counter utilized for updating the buffer register is preset to its maximum predetermined value N, which in the instant embodiment is 8 (degrees) for the bearing counter 230 and 4 (nautical miles) for the distance counter 232. The maximum-count quantities are stored in locations BGCTMX and DSCTMX, respectively, for the bearing counter 230 and the distance counter 232. If the new and old switch positions are identical, indicating no switch movement since the previous program cycle, program control transfers to a location NOCHG 1236 which initiates decrementing of the active one of the counters 230, 232. In a decision block 1244 the program tests the active counter to determine if decrementing the counter by 1 has reduced the counter output to zero; if the test is affirmative, control passes to a block 1246 wherein the active counter is set to 1. Thus, the counters are counted down 1 for each program cycle until movement of switch off the old position is detected, or if the switch remains dormant until the counter reaches a count of 1 the quantity 1 is retained in the counter as an update quantity until a different switch position is detected. The program time for the instant embodiment of the invention is 4.2 milliseconds. After presetting the active counter to N in the program portion SETMAX designated as a block 1259, or decrementing the active counter by 1 in the NOCHG program portion designated by block 1236, program control transfers to a STRNEW location designated block 1273. In the STRNEW block 1273 the current switch position data is stored in the working register designated for holding the old switch position; thus, during the next program cycle, the "new switch position" as previously described with reference to INCDEC subrouting, becomes the old switch position for the next program cycle.

At the end of the INCDEC subroutine, the IDRET block 1276, returns program control to a block 323' wherein the contents of the active one of the buffer registers 234, 236 is limit checked to insure that the value contained therein does not exceed a preestablished limit. The decision block following block 323' causes the program either to proceed servicing the second one of the switches 202, 204 via the routing designation B which repeats the INCDEC subroutine for the bearing switch 204, or transfers program control to a block 350 wherein the distance and bearing quantities contained in the buffer registers 234, 236 are converted to binary-coded decimal and loaded into the display registers 218, 220. After executing housekeeping functions related to displaying the distance and bearing values in the displays 222, 224, the program enters a timing loop which in the instant embodiment is 4.2 milliseconds as determined by instruction timing and the microcomputer clock rate. The timing loop establishes the program cycle time, after which control is transferred to the beginning of the program (NXTCYC).

In summary of the operation of the present invention as described hereinbefore, a counter is loaded with a preselected value N and then decremented by 1 at a fixed rate until the counter reaches a value of 1. The fixed rate is either the program cycle time of the microprocessor embodiment or the clock signal time of the hardware embodiment. Whenever a switch contact is detected while the counter is counting down, the then current counter value is added to or subtracted from the contents of a display buffer and the counter is again loaded with the predetermined value N. Assuming the data entry switch to be initially dormant, the hardware embodiment of the invention retains the preset value N in the counter until a new switch contact is detected, then initiates countdown of the counter; upon detecting another new switch contact, the buffer is updated and the counter again preset to N. Had the counter been in the process of counting down upon detection of the second new switch contact, i.e., the counter having a value between N and 1, the countdown is immediately restarted after presetting to N. On the other hand, had the counter reached a count of 1 before detection of the second new switch contact, the preset value N is retained in the counter until the next subsequent switch contact is detected.

The microprocessor embodiment of the invention operates somewhat differently than the hardware implemented embodiment. During the operation of the microprocessor embodiment of the invention, which is considered to be the best mode of operation, upon detecting a new switch position the buffer register is immediately updated utilizing the contents of the counter, regardless of whether the counter is still counting down or has already reached the ultimate count 1. After updating the buffer register, the counter is preset to the predetermined value N and the countdown is immediately restarted in the next program cycle. Thus in the dormant position, i.e., when there is no movement of the data entry switches, the microprocessor embodiment retains a count of 1 in the counter; the hardware implemented embodiment retains the preset value N in the counter when the input switches are dormant.

While the principles of my invention have now been made clear in the foregoing illustrative embodiments, there will be immediately obvious to those skilled in the art many modifications of structure, arrangement, proportions, the elements, material and components used in the practice of the invention, and otherwise, which are particularly adapted for specific environments and operating requirements without departing from those principles. The apended claims are, therefore, intended to cover and embrace any such modifications, within the limits only of the true spirit and scope of my invention.

What is claimed is:

1. In apparatus of the type having an operating parameter displayed as a digital number and a manual control for entering data altering the displayed number, the manual control having a plurality of detents regularly spaced apart, a process for selectively varying the rate of the data entry depending on the speed of movement of the manual control, the process comprising the steps of:
    (a) selecting a number greater than one least-significant unit of the displayed number and representative of the physical and dynamic characteristics of the manual control;
    (b) sensing said manual control positioned on one of said plurality of detents;
    (c) decrementing the selected number by a value representative of one least-significant unit of the digital number;
    (d) periodically repeating the decrementing step until occurrence of the movement sensing step or until the decremented number reaches the value representative of one least-significant unit of the digital number, the period between successive decrementing steps being a submultiple of a predetermined maximum period for moving the manual control one detent, during which maximum period the number being decremented is greater than the value representative of one least-significant unit of the digital number;
    (e) sensing movement of said manual control off the one detent;
    (f) sensing said manual control positioned on a detent ajdacent the one detent; and
    (g) adding the decremented number to the displayed number.

2. The process as claimed in claim 1, wherein the third sensing step includes sensing the direction of the movement of the manual control between the one detent and the adjacent detent, either in a first direction or in a direction opposite the first direction; and the adding step includes adding the absolute value of the decremented number to the displayed number when the sensed movement of the control is in the first direction and adding the ones complement of the decremented number to the displayed number when the sensed movement of the control is in the opposite direction.

3. Apparatus having data input means, comprising:
    means for timing;
    means responsive to said timing means for periodically displaying a number representative of an operating parameter of said apparatus;
    first means coupled to said display means for storing the number for display;
    a manual switch having a plurality of detents regularly spaced apart;
    means coupled to said switch for sensing movement of said switch from one of the detents to an adjacent one of the detents;
    second means for storing a predetermined incremental number greater than one least-significant unit of the number for display;
    means responsive to said timing means and said sensing means for periodically counting down the incremental number in said second storage means to a second number representative of one least-significant unit of the number for display;
    control means responsive to said sensing means for stopping said counting means when the movement of said switch to the adjacent detent is sensed prior to the incremental number reaching the second number;
    said control means including means responsive to said sensing means having sensed the movement of said switch to the adjacent detent for incrementing the number for display in said first storage means by the incremental number in said second storage means; and
    said control means including means operative after operation of said incrementing means for restoring the predetermined number in said second storage means.

4. Data input means as claimed in claim 3 wherein said sensing means includes means for directional sensing of the movement of said switch; and said incrementing means includes means responsive to said directional sensing means for incrementing the number for display by the absolute value of the incremental quantity when the switch movement is in a first direction and by the ones complement of the incremental number when the switch movement is in a direction other than the first direction.

5. Numeric display apparatus having variable rate data input means, comprising:
    first means for storing a number for display;
    second means for storing an incremental quantity;
    a manual switch having a plurality of detents regularly spaced apart;
    control means for presetting the incremental quantity in said second storage means to a predetermined number, said control means including means coupled to said switch for sensing movement of said switch from one of the detents to a detent adjacent the one detent, said second storage means including means responsive to said control means for counting the incremental quantity at a predetermined rate from the predetermined number to a second number representative of one least-significant unit of the number for display, the product of the predetermined number and the predetermined rate being a maximum period between successive movements of said switch from the one detent to the adjacent detent after which maximum period the incremental quantity is the second number; and means responsive to said sensing means for adding the contents of said second storage means to the contents of said first storage means.

6. The numeric display apparatus as claimed in claim 5, wherein said sensing means includes means for directional sensing of movement of said switch; and said adding means includes means responsive to said directional sensing means for adding the contents in absolute value form of said second storage means to the contents of said first storage means when the switch movement is in a first direction and adding the contents in ones complement form of said second storage means to the contents of said first storage means when the switch movement is in a direction other than the first direction.

7. Data input apparatus, comprising:

a digital display;

a buffer coupled to said display, said buffer storing a number for display;

a manual switch having a plurality of discrete contacts equally spaced apart;

control means coupled to said switch for sensing a movement of said switch from one of the contacts to an adjacent one of the contacts, said control means including means for generating a series of timing signals at a preselected rate;

a counter coupled to said control means, said counter being preset to a predetermined number and responsive to said control means to count down from the predetermined number at the rate of the timing signals;

an adder coupled to said buffer and to said counter, said adder responsive to a control signal received from said control means when said counter reaches a count of one to add the contents of said counter to said buffer, said adder further responsive to said control means prior to said counter reaching the count of one and upon said control means sensing said switch movement to add the contents of said counter to said buffer for subsequent display in said digital display.

8. Data input apparatus, comprising:

a digital display;

a buffer coupled to said display, said buffer storing a number for display;

a manual switch having a plurality of discrete contacts equally spaced apart;

control means coupled to said switch for sensing a movement of said switch from one of the contacts to an adjacent one of the contacts, said control means including means for generating a series of timing signals at a preselected rate;

a counter coupled to said control means, said counter being preset to a predetermined number and responsive to said control means to count down from the predetermined number at the rate of the timing signals, said counter further responsive to said control means to stop counting when the contents of counter reaches 1; and an adder coupled to said buffer and to said counter, said adder responsive to said control means upon sensing said switch movement from the one contact to the adjacent one of the contacts to add the contents of said counter to said buffer subsequent display in said digital display.

9. In apparatus of the type having an operating parameter for display as a digital number, means for entering data at a variable rate for altering the digital number, comprising:

a manual control having a plurality of detents regularly spaced apart;

means for generating timing signals having a frequency greater than the maximum possible frequency of movement of said manual control between successive ones of the detents;

first means for storing the digital number;

means coupled to said first storage means for periodically displaying the digital number;

second means for storing a predetermined incremental number;

means coupled to said manual control for sensing said manual control positioned initially on one of said plurality of detents and subsequently on a detent adjacent the one detent;

means responsive to said sensing means for counting down the incremental number in said second storage means at the frequency of said timing signal generating means from the predetermined number to a terminal number, said counting means being enabled to count only during a period when said sensing means senses said manual control positioned on the one detent, said counting means being disabled prior to the end of the period if the terminal number reaches a value representative of one least-significant unit of the digital number;

means responsive to said sensing means for adding the terminal number in said second storage means to the digital number in said first storage means, said adding means being operative when said sensing means senses the adjacent detent; and means responsive to said sensing means subsequent to the operation of said adding means for restoring the predetermined number in said second storage means.

10. Variable rate data entry means as claimed in claim 9, wherein said sensing means further includes means for sensing said manual control positioned subsequently on another detent adjacent the one detent; and said adding means includes means responsive to said sensing means for adding the ones complement of the terminal number in said second storage means to the digital number in said first storage means, said ones complement adding means being operative when said sensing means senses the other adjacent detent.

11. Variable rate data input apparatus, comprising:

a digital display;

a manual control having a plurality of detents regularly spaced apart; and control means coupled to said digital display and to said manual control for entering digital data altering said display at a rate determined by the speed of movement of said manual control between successive ones of the detents, said control means comprising:

first means coupled to said digital display for storing a number for display;

second means for storing an incremental number;

means for timing;

means coupled to said manual control for detecting movement of said manual control from one of the detents to a detent adjacent the one detent;

means responsive to said movement detecting means initially for counting the incremental number in said second storage means from a predetermined number to a second number representative of one least-significant unit of the number for display, said counting means being further responsive to said timing means for counting at a basic rate, the product of the basic rate and the predetermined number being a maximum period for operation of said manual control between two adjacent ones of the detents during which maximum period the incremental number is greater than the second number;

means responsive to said movement detecting means for adding the incremental number in said second storage means to the number for display in said first storage means;

means operative subsequent to the operation of the adding means for loading the second storage means with the predetermined number; and means responsive to said timing means for periodically displaying the number for display in said digital display.

12. The variable rate data input apparatus as claimed in claim 11, wherein the detecting means further includes means for directionally sensing the movement of said manual control; and the adding means further includes means responsive to the sensing means for adding the absolute value of the incremental number to the number for display when a first direction is sensed and adding the ones complement of the incremental number to the number for display when a direction other than the first direction is sensed.

13. In apparatus of the type having an operating parameter displayed as a digital number and a manual control for entering data altering the displayed number, the manual control having a plurality of detents regularly spaced apart, a process for selectively varying the rate of the data entry depending on the speed of movement of the manual control, the process comprising the steps of:

(a) selecting a number representative of the physical and dynamic characteristics of the manual control;

(b) detecting movement of the manual control off one of the detents;

(c) decrementing the selected number by a value representative of one least-significant digit of the digital number;

(d) periodically repeating step (c) until the occurrence of step (e) or until the decremented number equals the value representative of one least-significant unit of the digital number, the period between successive decrementing steps being a submultiple of a predetermined maximum period for moving the manual control one detent, during which maximum period the number being decremented is greater than the value representative of one least-significant unit of the digital number;

(e) sensing movement of the manual control to a detent adjacent to the one detent;

(f) adding the decremented number to the displayed number; and (g) repeating steps (c) through (f) upon detecting further movement of the manual control off a detent.

14. The process as claimed in claim 13, wherein the sensing step includes sensing the direction of the movement of the manual control in a first direction or in a direction opposite the first direction; and the adding step includes adding the absolute value of the decremented number to the displayed number when the sensed movement of the control is in the first direction and adding the ones complement of the decremented number to the displayed number when the sensed movement of the control is in the opposite direction.

15. In apparatus of the type having means for displaying an operating parameter as a digital number and a manual control for entering data altering the displayed number, the manual control having a plurality of detents regularly spaced apart, a process for selectively varying the rate of the data entry depending on the speed of movement of the manual control, the process comrprising the steps of·

(a) selecting a number within the range of the display means, the selected number being greater than one least-significant unit of the displayed number and representative of the physical and dynamic characteristics of the manual control;

(b) sensing the manual control positioned on one of the plurality of detents;

(c) linearly decrementing the selected number until (c1) the decremented number reaches a number representative of one least-significant unit of the displayed number, then proceeding to step (c3), or (c2) sensing movement of the manual control off the one detent, then proceeding to step (c3), or (c3) sensing the manual control positioned on a detent adjacent the one detent;

(d) adding the decremented number to the displayed number.

16. The process as claimed in claim 15, wherein the sensing step (c3) includes sensing the direction of the movement of the manual control between the one detent and the adjacent detent in a first direction or in a direction opposite the first direction; and the adding step includes adding the absolute value of the decremented number to the displayed number when the sensed movement of the control is in the first direction and adding the ones complement of the decremented number to the displayed number when the sensed movement of the control is in the opposite direction.

17. Variable-rate data input apparatus, comprising:

a digital display;

a manual control having a plurality of detents regularly spaced apart;

a sensing circuit coupled to said manual control, said sensing circuit being responsive to movement of said manual control between adjacent ones of the plurality of detents to generate a first control signal;

a register coupled to the display, said register having a number for display stored therein;

a counter having a predetermined incremental number stored therein, the predetermined number being greater than one least-significant unit of the number for display;

a timing circuit generating a timing signal at a basic rate;

a gate circuit coupled between said timing circuit and said counter, said gate circuit being responsive to the first control signal to transfer the timing signal to said counter, said counter being responsive to the timing signal to count the incremental number down at the basic rate;

a decode circuit coupled to said counter, said decode circuit being responsive to output signals of the counter representative of the incremental number reaching one least-significant unit of the number for display to generate a second control signal, said gate circuit being responsive to the second control signal to disable the transfer of the timing signal to said counter, thereby stopping said counter from counting;

an adder receiving a first input signal representative of the number for display from said register and a second input signal representative of the incremental number from said counter, an output signal of said adder being coupled to said register;

a first control circuit coupled to said counter and to said register, said first control circuit being responsive either to the second control signal or to termination of the first control signal to gate the contents of said counter and said rgister through said adder for subsequent storage in said register, thereby adding the incremental number for display;

a second control circuit to preset said counter to the predetermined number, after the incremental number has been added to the number for display; and a display circuit coupled to said digital display and responsive to said timing circuit for periodically displaying the number for display in said digital display.

18. The variable rate data input apparatus as claimed in claim 17, further comprising:

a direction-sensing circuit coupled to said manual control;

a multiplexer circuit intermediate said counter and said adder, said multiplexer circuit being responsive to said direction-sensing circuit to gate the output signal of said counter to said adder when the movement of said manual control is in a first direction and to gate the ones complement of the output signal of said counter to said adder when the movement of said manual control is in a direction other than the first direction.

* * * * *